(12) United States Patent
Rumsey et al.

(10) Patent No.: US 7,263,768 B2
(45) Date of Patent: Sep. 4, 2007

(54) METHOD OF MAKING A SEMICONDUCTOR DEVICE HAVING AN OPENING IN A SOLDER MASK

(75) Inventors: Brad D. Rumsey, Meridian, ID (US); Matt E. Schwab, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 10/927,253

(22) Filed: Aug. 25, 2004

(65) Prior Publication Data

US 2005/0022379 A1 Feb. 3, 2005

Related U.S. Application Data

(62) Division of application No. 10/286,181, filed on Oct. 31, 2002, now Pat. No. 7,146,720, which is a division of application No. 09/888,674, filed on Jun. 25, 2001, now Pat. No. 6,668,449.

(51) Int. Cl.
*H05K 3/34* (2006.01)
*H05K 1/03* (2006.01)

(52) U.S. Cl. ............................. 29/840; 29/832; 29/841; 29/847; 29/855; 29/884; 257/678; 257/680; 174/255; 438/118

(58) Field of Classification Search .......... 29/825–834, 29/840–842, 846–847; 174/255, 259, 260, 174/262, 264; 257/692, 797; 438/118, 126, 438/200, 462; 430/328
See application file for complete search history.

(56) References Cited

U.S. PATENT DOCUMENTS

| | | |
|---|---|---|
| 5,420,460 A | 5/1995 | Massingill |
| 5,701,013 A | 12/1997 | Hsia et al. |
| 5,712,707 A | 1/1998 | Ausschnitt et al. |
| 5,757,507 A | 5/1998 | Ausschnitt et al. |
| 5,789,118 A | 8/1998 | Liu et al. |
| 5,912,438 A | 6/1999 | Kubin |
| 5,953,128 A | 9/1999 | Ausschnitt et al. |
| 5,976,740 A | 11/1999 | Ausschnitt et al. |
| 6,023,338 A | 2/2000 | Bareket |
| 6,031,614 A | 2/2000 | Michaelis et al. |
| 6,048,755 A | 4/2000 | Jiang et al. |
| 6,063,530 A | 5/2000 | Grassmann |
| 6,068,954 A | 5/2000 | David |
| 6,141,082 A | 10/2000 | Nara et al. |
| 6,200,824 B1 | 3/2001 | Hashimoto |
| 6,242,281 B1 | 6/2001 | Mclellan et al. |

(Continued)

OTHER PUBLICATIONS

Ausschnitt et al., "Seeing the forest for the trees: a new approach to CD control", pp. 212-220, undated.

(Continued)

*Primary Examiner*—Minh Trinh
(74) *Attorney, Agent, or Firm*—TraskBritt

(57) ABSTRACT

The present invention features a novel design for a fiducial and pin one indicator that utilizes a single solder resist opening in a die mounting substrate to perform the combined functions of prior art fiducials and pin one indicators. Methods of fabricating a carrier substrate and fabricating a semiconductor device package using the combination pin one indicator and alignment fiducial of the present invention are also provided.

52 Claims, 13 Drawing Sheets

U.S. PATENT DOCUMENTS

| | | |
|---|---|---|
| 6,278,193 B1 | 8/2001 | Colco et al. |
| 6,441,504 B1 | 8/2002 | Glenn et al. |
| 6,480,394 B1 | 11/2002 | Feld et al. |
| 6,534,861 B1 | 3/2003 | Castro |
| 6,668,449 B2 | 12/2003 | Rumsey et al. |
| 6,891,108 B2 | 5/2005 | Prindiville et al. |
| 2002/0020908 A1 | 2/2002 | Prindiville |
| 2002/0043401 A1 | 4/2002 | Prindiville et al. |
| 2002/0148897 A1 | 10/2002 | Rumsey |

OTHER PUBLICATIONS

Kim et al., "Automatic In-situ Focus Monitor Using Line Shortening Effect", pp. 184-193, Mar. 1999.

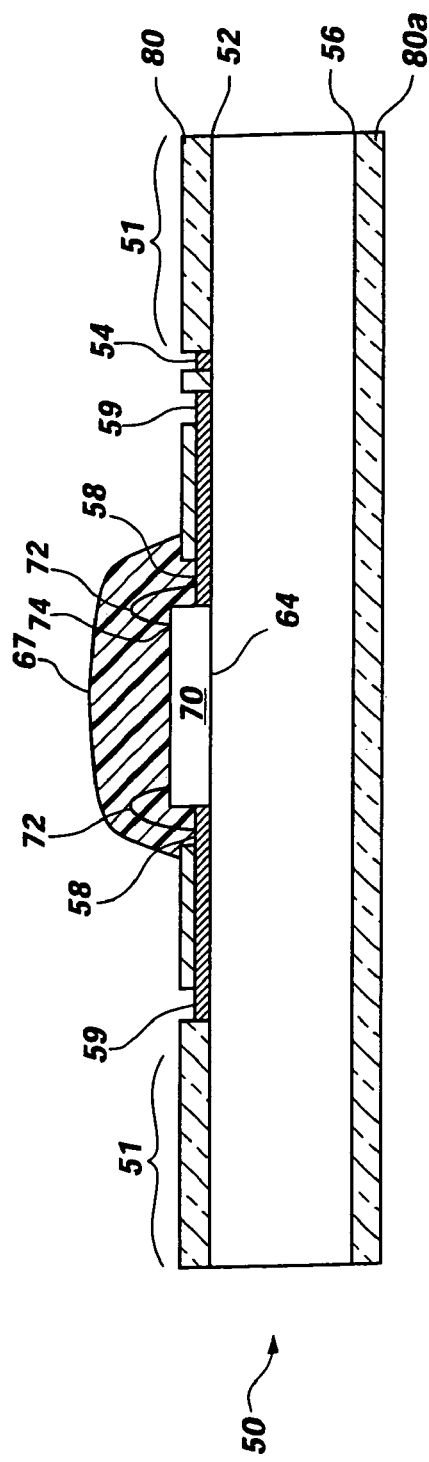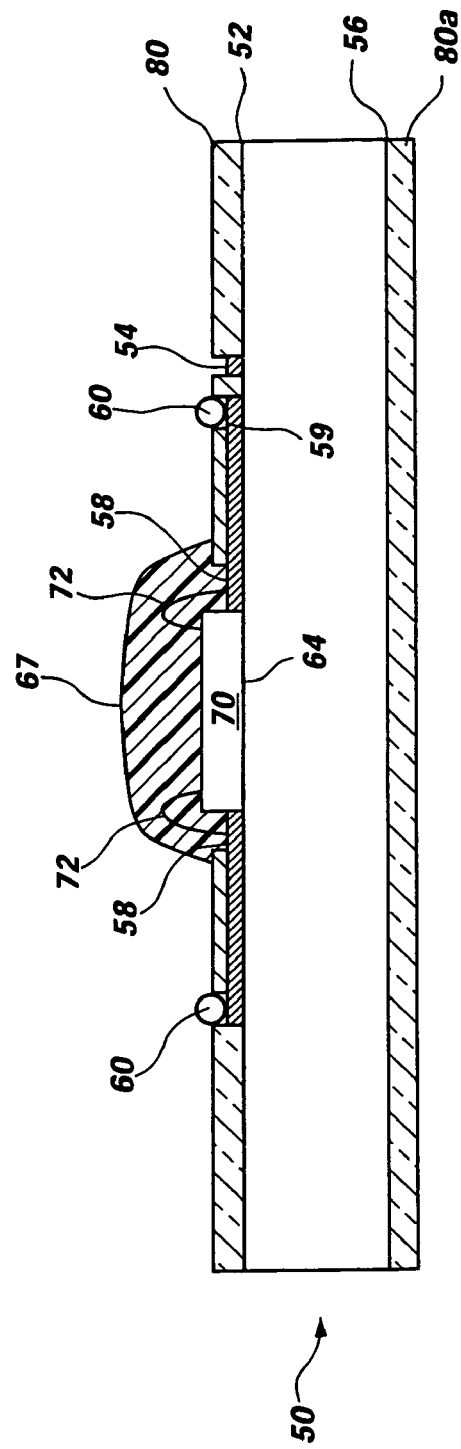

METHOD OF MAKING A SEMICONDUCTOR DEVICE HAVING AN OPENING IN A SOLDER MASK

CROSS-REFERENCE TO RELATED APPLICATIONS

This application is a divisional of application Ser. No. 10/286,181, filed Oct. 31, 2002 now U.S. Pat. No. 7,146,720, which is a divisional of application Ser. No. 09/888,674, filed Jun. 25, 2001, now U.S. Pat. No. 6,668,449, issued Dec. 30, 2003.

BACKGROUND OF THE INVENTION

1. Field of the Invention

This invention relates generally to ball grid array packages. More specifically, this invention relates to a method of using a single solder resist opening on a ball grid array substrate as both a saw fiducial and a pin one indicator.

2. State of the Art

Integrated circuits (ICs) are typically fabricated on a semiconductor wafer. To achieve the many semiconductor devices which may be formed thereon, the semiconductive wafer is subjected to deposition, etching, planarization and lithographic processes. The wafer is then cut or "diced" to form multiple semiconductor dice or semiconductor devices (IC chips). Typically, these individual semiconductor devices are transferred to a mounting substrate by an automatic "pick and place" process. Thereafter, a semiconductor device is electrically connected to the substrate and encapsulated by a molding apparatus into a final package. As trends continue toward higher performance, high input/output, and high board-manufacturing-yield, Ball Grid Array (BGA) packaging has become the technology of choice. In an ever increasing number of semiconductor applications, therefore, semiconductor devices or IC chips are mounted onto printed circuit boards or other mounting substrates which utilize BGA packaging methods.

Currently, some types of BGA packages, including fine pitch ball grid array (FPBGA) and micro ball grid array (μBGA) semiconductor device packages, are known in the art. The various types of BGA packages that have been developed include BGAs mounted on printed wiring boards, leadframes, and flexible tape. Presently, due to the need for smaller devices having a higher lead count and a smaller footprint, BGAs are used in chip scale packaging with increasing frequency.

One type of BGA package, known as "board-on-chip," is shown in drawing FIGS. 1 and 2. A board-on-chip BGA package 1 typically comprises a substrate 10 having an upper or top surface 12, an opposing bottom surface 16, and an elongated aperture 15 extending through the middle thereof. Substrate 10 is typically a polymer laminate printed circuit board, although ceramics and other types of substrates may be used. During a die attach process, a semiconductor die 20 is mounted on the bottom surface 16 of the substrate 10 using an adhesive, adhesive and tape and/or adhesively coated tape, having active surface 22 of semiconductor die 20 upwardly facing and positioned below aperture 15. Active surface 22 of semiconductor die 20 is configured having a plurality of bond pads 24 in single or multiple columns thereon which are substantially aligned with elongated aperture 15 as illustrated therein. As illustrated in drawing FIG. 1, bond pads 24 can be viewed through elongated aperture 15 as they are substantially aligned. Upper surface 12 of substrate 10 comprises a conductor surface wherein circuit traces 17 are formed, typically by etching, in a desired pattern. Alternatively, circuit traces 17 are formed on the semiconductor device side of substrate 10, or are formed internally within substrate 10. Circuit traces 17 are interconnected with a plurality of bond pads 18 and an array of contact pads 19 located along the periphery of elongated aperture 15 and extending from circuit traces 17, respectively. Bond pads 18 and contact pads 19 are generally located at separate terminal ends of circuit traces 17, as can be seen in drawing FIG. 1. Contact pads 19 are formed in arrays of varying numbers, dependent upon the specific application of the package. Each contact pad 19 typically comprises a solderable surface mount pad which is formed of a conductive metal, such as copper.

As shown in drawing FIG. 2, substrate 10 also includes a laminated or screen printed solder resist layer, or solder mask 40. Solder mask 40 is formed over top and bottom surfaces 12 and 16 and comprises an electrically insulating, low surface tension material which shields conductive members on top and bottom surfaces 12 and 16, respectively, from subsequent soldering and/or plating operations that might result in electrical shorts. The layer of solder resist comprising solder mask 40 initially may, if desired, cover all portions of surfaces 12 and 16 (including bond pads 18 and contact pads 19), with the exception of a semiconductor device receiving area of the substrate 10.

In a subsequent step, a pattern of via openings 42 is created in solder mask 40, via openings 42 corresponding to portions of bond pads 18 and contact pads 19 to which conductive elements, such as conductive wires 26 and solder balls 30, are respectively attached. To mask the areas over bond pads 18 and contact pads 19, solder mask 40 must obviously be deposited in a thickness at least minimally greater than the height of bond pads 18 and contact pads 19. Typically, the solder mask used to cover substrate 10 is a photoimageable material that can be blanket deposited as a wet or dry film. By using photolithographic processes, via openings 42 of predetermined diameters are formed by exposing and developing a desired pattern on the resist areas through a photoimaging mask, resulting in the removal of resist material and the exposure of bond pads 18 and contact pads 19.

Through a wire bonding process, conductive wires 26 extend from bond pads 24 of semiconductor die 20 through elongated aperture 15 to bond pads 18 located in the wirebonding area on terminal end portions of circuit traces 17 on or within substrate 10. Conductive wires 26 serve to electrically connect the bond pads 24 of semiconductor die 20 to bond pads 18 of substrate 10. In turn, bond pads 18 are electrically connected to contact pads 19 by circuit traces 17. Contact pads 19 are then placed in contact with respective electrically conductive, connective elements such as solder balls 30. Alternatively, solder balls 30 are placed directly upon, or in electrical communication with, the termination point of a selected circuit trace 17. Solder balls 30 may be filled with any suitable metal, such as gold, although other conductive metal-based solder balls or conductive filled epoxy materials are frequently used. As illustrated in drawing FIG. 2, conductive wires 26, die bond pads 24, and bond pads 18 are shown covered with a layer of protective encapsulant 25. A protective encapsulant 25 is also shown covering the inactive backside surface of semiconductor die 20 and bottom surface 16 of substrate 10.

Bond pad geometries are typically formed as a standard round shape. Because of the excellent self-centering property of solder ball interconnections, BGA applications have significantly greater misalignment tolerances than other interconnection techniques, such as quad flatpack leads. As such, relatively wide variations in solder ball placement are accommodated during reflow of the solder joints. Generally, the rule of thumb is that solder balls must have a radial placement accuracy wherein the solder is at least "half on pad."

Generally, the types of bond pad layouts presently known in the art are Solder Mask Defined bond pad layouts and Non-Solder Mask Defined bond pad layouts. In Solder Mask Defined layouts of bond pads, the opening in the solder resist defining the solder ball mounting area is made smaller than the copper, or any suitable type metal, bond pad disposed underneath. Thus, the solder mask overlaps with the edge of the copper pad. This arrangement carries with it the advantage of providing better copper pad definition, since Solder Mask Defined layouts of bond pads are located by photo-imaging, rather than by copper etching as is the case for Non-Solder Mask Defined pads.

In contrast, bond pads which are formed by Non-Solder Mask Defined layouts of bond pads have a solder mask opening which is larger than the copper pad, or any suitable type metal pad. In this situation, the size of the copper defines the size of the pad, and the size of the pad is determined by a copper etching process. Non-Solder Mask Defined layouts of bond pads are considered less accurate than those determined by solder mask photoimaging processes but offer advantages in that vision system registration of copper fiducials gives an exact location of the site so that any mis-registration error in regards to photoimaging the Solder Mask Defined layouts of pads will shift the location of the entire site relative to the vision fiducials.

Referring again to drawing FIGS. 1 and 2, to bond the solder balls to contact pads 19, flux is typically applied to contact pads 19 or to solder balls 30 and/or to both. Solder balls 30 are then placed in the via openings 42 over contact pads 19, and the solder is reflowed into a metallurgical solder bond. During the reflow process, the via openings 42 in solder mask 40 aid in positioning solder balls 30.

Contact pads 19 can be arranged in a grid array pattern wherein the conductive elements or solder balls 30 of a preselected size, or sizes, are spaced away from each other at one or more preselected distances, or pitches. Typically, solder ball sizes can be approximately 0.6 mm or less, and the solder balls may have a spacing, or pitch, of approximately 0.80 mm or less. When using tape substrates, high package densities with pitches approaching 0.05 mm are possible. In BGA arrangements using Plated Through-Hole (PTH) technology, consideration must be given to the placement of the bond pad. Bond pads which are placed too closely to a hole run the risk of solder melting and flowing into the hole, the wicking of the solder potentially creating a situation where the solder does not wet the entire bond pad, thus creating an "open" for that lead.

In packages using FPBGA or μBGA patterns, contact pads 19 are spaced at very small distances from each other, resulting in dimensionally small spacings or pitches for relatively small conductive elements, or solder balls 30, placed thereon.

Illustrated in drawing FIG. 3 is a top view of a portion of a BGA package 1 containing an unencapsulated BGA package 1, prior to singulation of BGA substrate 10. BGA substrate 10 is shown incorporating the use of a prior art alignment mark or fiducial 44 and a pin one indicator 46. Used for accurate automated assembly, alignment marks or fiducials 44 and pin one indicator 46 are typically incorporated on upper surface 12 of substrate 10. Alignment marks or fiducials 44, for example, ensure that substrate 10 is properly aligned and positioned for the automated mounting of a semiconductor die 20. As shown in drawing FIG. 3, marks for this purpose are generally found aligned with the lateral edges and the center axis of the substrate area in which semiconductor die 20 is to be attached. Alignment marks or fiducials 44, when set in "street lines," may also be used for aligning a saw or other severing equipment to be used for the singulation or separation of BGA packages. Generally, alignment marks or fiducials 44 for the alignment of singulation or severing equipment are disposed on a peripheral area of substrate 10; the peripheral areas typically used as a clamping area during the encapsulation of semiconductor die 20 and its related interconnections within BGA package 1.

Pin one indicator 46 is used by automated die attach apparatus to orient semiconductor die 20 in the proper configuration. Pin one indicator 46 is generally positioned in close proximity to the semiconductor device mounting site in an area of the solder resist not occupied by bond pads 18, contact pads 19, or circuit traces 17.

Typically, pin one indicator 46 and alignment marks or fiducials 44 are formed as openings in the solder mask 40 (see drawing FIG. 2), allowing an underlying conductive feature (e.g., Cu, Au, Ni, etc.) to show through. Thus, the conductive feature showing through typically comprises the same metal as that of the conductors (i.e., bond pads 18, contact pads 19, and circuit traces 17) formed over the substrate surface. Methods for forming the pin one indicator 46 and alignment marks or fiducials 44 include exposure by photolithographic processes and the use of lasers. The shape of pin one indicators 46 and alignment marks or fiducials 44 are known to vary in the art. As shown in drawing FIG. 3, a standard design for a pin one indicator 46 is a triangularly shaped opening in the solder resist, while a standard design for an alignment mark or fiducial 44 is typically formed from openings in the solder resist fashioned as an X-Y axis.

Generally, automated die attachment apparatus use a vision system to locate a fiducial 44 and/or pin one indicator 46 on a substrate. By detecting the position of the fiducial 44 and pin one indicator 46, the position and orientation of substrate 10 can be accurately detected. Fiducials and pin one indicators (not shown), such as fiducials 44 and pin one indicators 46 on substrate 10, can also typically be found on semiconductor die 20 for orienting the semiconductor die 20 during the automated pick and place process. The vision system uses the semiconductor device fiducials and substrate fiducials 44 and pin one indicators 46 to check semiconductor die 20 position on the pickup tool and then drives the die attach apparatus to adjust the die tool and substrate position for accurate semiconductor die 20 placement. A relatively simple system of vision recognition is the black and white digital recognition system (DRS). For a higher degree of sophistication in recognition, a pattern recognition system (PRS) can be used as a vision system.

Typically, the vision system reads the pin one indicator on the solder resist by scanning for contrasts and adjusting the backlighting to achieve the proper reflection. Using an X-Y table for proper alignment, the vision system checks the semiconductor die 20 position on the die pickup tool and directs the die machine to adjust the substrate and die tool into the correct positions, using X,Y, and θ (theta) directions, for precise semiconductor die 20 placement. Typically, semiconductor dice are presented to a bonding machine in wafers which may be mounted on tape on metal frames. For some die bonding machines, semiconductor dice may also be presented in gel or waffle packs. In the die bonding process, semiconductor dice are selectively picked from those of wafers respectively probe-tested in their manufacturing process using various testing equipment. Meanwhile, a mounting substrate has been indexed to the die attach site where a precise amount of adhesive, such as epoxy resin, is applied. The picked-up semiconductor device is then bonded to the die attach site of the mounting substrate via the adhesive. After the semiconductor die 20 has been adhesively mounted to the mounting substrate, a wire bonding process can take place.

Still referring to drawing FIG. 3, an accurate placement of semiconductor die 20 is critical for good wire bonding. Therefore, separate pin one indicators 46 and/or alignment marks or fiducials 44 must be used for each semiconductor die 20 in each multi-device bonding area on a substrate 10. For wire bonding, sophisticated vision systems are required to accurately and reliably position the vast numbers of wire bonds to be made in a package manufacturing operation. Furthermore, the accuracy of placement of a ball bond is particularly critical if using fine-pitch wire bonding technology. Therefore, PRS vision systems, in combination with alignment marks or fiducials 44, are typically used. During the wirebonding process, a substrate 10 is moved and indexed from bonding site to bonding site through a clamping apparatus which retains the substrate at sequential bonding sites for producing a plurality of wire-bonded semiconductor devices. In this process, guide holes 21 may be used for coarse alignment, while alignment marks or fiducials 44 are typically used to aid in precise alignment. In this process, the alignment marks or fiducials 44 may be formed separately from other alignment marks or fiducials which may be used for, e.g., die attach or saw singulation. Conductive wires 26 extending from bond pads 24 of the active surface 22 of a semiconductor die 20 are then bonded to bond pads 18 surrounding aperture 15. Several choices may be made in the particular wire bonding process to be used. The selection of the proper wire bonding process is generally based on the pad pitch, device characteristics, and throughput requirements. Typically, either thermosonic ball bonding or ultrasonic wedge bonding is used. While thermosonic gold ball wire bonding is used for the majority of fine-pitch wire bonding, ultrasonic gold or aluminum wedge wire bonding is used for pad pitches below 60 µm.

Subsequent to wire bonding, semiconductor die 20 and its related electrical interconnections are subjected to a molding process where they are encapsulated to protect them from the outside environment. Typically, encapsulation entails positioning substrate 10 on a lower mold platen such that the portions to be encapsulated are in registration with multiple mold cavities formed in the lower mold platen. The mold is then closed when the upper platen, also containing a mold cavity, is lowered onto the lower platen. When the mold is closed, a peripheral portion of substrate 10, usually containing alignment marks or fiducials 44, is typically compressed between the upper and lower platens to seal the mold cavities in order to prevent leakage of liquefied plastic molding compound. After wire bonding, individual or groups of packages are separated from one another by a cutting process, typically making use of alignment marks or fiducials 44 for the positioning of the singulation equipment to allow cutting along a package edge.

Several disadvantages are known in the art with regard to the use of conventional pin one indicators 46 and alignment marks or fiducials 44. First, while pin one indicators 46 and fiducials 44 are completely unnecessary for the operating characteristics of the completed BGA package, their presence disadvantageously takes up valuable real estate on substrate 10. This is problematic since the trend in industry today is towards smaller, yet denser packages. Foreseeably, higher density ball grid arrays will be used which will be populated so as to encroach on the package edge, resulting in smaller array pitches and tighter dimensional controls. For example, industry is increasingly moving towards widespread use of the "chip scale package," in which the footprint of the package is only approximately twenty percent or less larger than that of the semiconductor device. Therefore, as BGA packages shrink and as density increases, it is desirable to make pin one indicators 46 and fiducials 44 as small as possible. Furthermore, large pin one indicator 46 and fiducial 44 openings in the solder resist can interfere with the operation of defect scanning vision systems. Finally, saw fiducials are typically placed in the encapsulation clamping areas where the non-planar solder resist surface that forms the fiducial can lead to resin bleed or flashing over the bond pads or contact pads during the molding process.

Accordingly, what is needed in the art are pin one indicators and fiducials which reduce the size of solder resist openings, thereby taking up a minimal amount of space and maintaining a substantially planar solder resist substrate surface.

BRIEF SUMMARY OF THE INVENTION

The present invention features a novel design for a fiducial and pin one indicator that utilizes a single solder resist opening in a die mounting substrate to perform the combined functions of prior art fiducials and pin one indicators. Methods of fabricating a carrier substrate and fabricating a semiconductor device package using the combination pin one indicator and alignment fiducial of the present invention are also provided. Preferably, the pin one indicator/alignment fiducial comprises an "L"-shaped narrow opening in the solder mask layer in which two lines, substantially mutually perpendicular to one another, form components of an X-Y axis. In one embodiment, the combination pin one indicator/alignment fiducial is placed relatively closely adjacent (as compared to prior art pin one indicators and fiducials) an array of contact pads on a mounting substrate configured for receiving a semiconductor device. Preferably, the contact pads are arranged in a dense array for forming a fine pitch ball grid array (FPBGA) or µBGA. The distinctive configuration of the combination fiducial/pin one indicator is recognized by a vision system and allows for precise orientation and alignment of a semiconductor device during die attach. The combination pin one indicator/alignment fiducial may also be used for alignment in wire bonding and as an alignment fiducial for a singulation saw or other substrate severing apparatus employed to separate individual semiconductor device packages from a substrate array.

In a preferred embodiment, the pin one indicator/alignment fiducial of the present invention is solder mask defined by use of a laser to produce a highly defined and accurate mark. Photoimaging processes known in the art may also be used to define the pin one indicator/alignment fiducial. Conventional photoimaging methods may further be combined with stereolithographic processes to tighten solder mask exposure around the pin one indicator/alignment fiducial and the contact pads of a ball grid array.

The pin one indicator/alignment fiducial of the present invention further provides only a minimal opening in the solder resist, thus allowing for smaller pitches between solder balls and tighter dimensional controls. Therefore, the present invention is particularly useful for packages in which the solder resist surface of the mounting substrate is heavily populated with contact pads and/or solder balls, and/or in applications where the semiconductor device outline is nearly the same size as the package (e.g., Chip Scale Packages (CSP), Near Chip Size (NCS), etc.).

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention:

FIGS. 7A through 7F are schematic cross-sectional views illustrating various processing steps during the fabrication of a carrier substrate and a semiconductor device package;

DETAILED DESCRIPTION OF THE INVENTION

Figure 1:
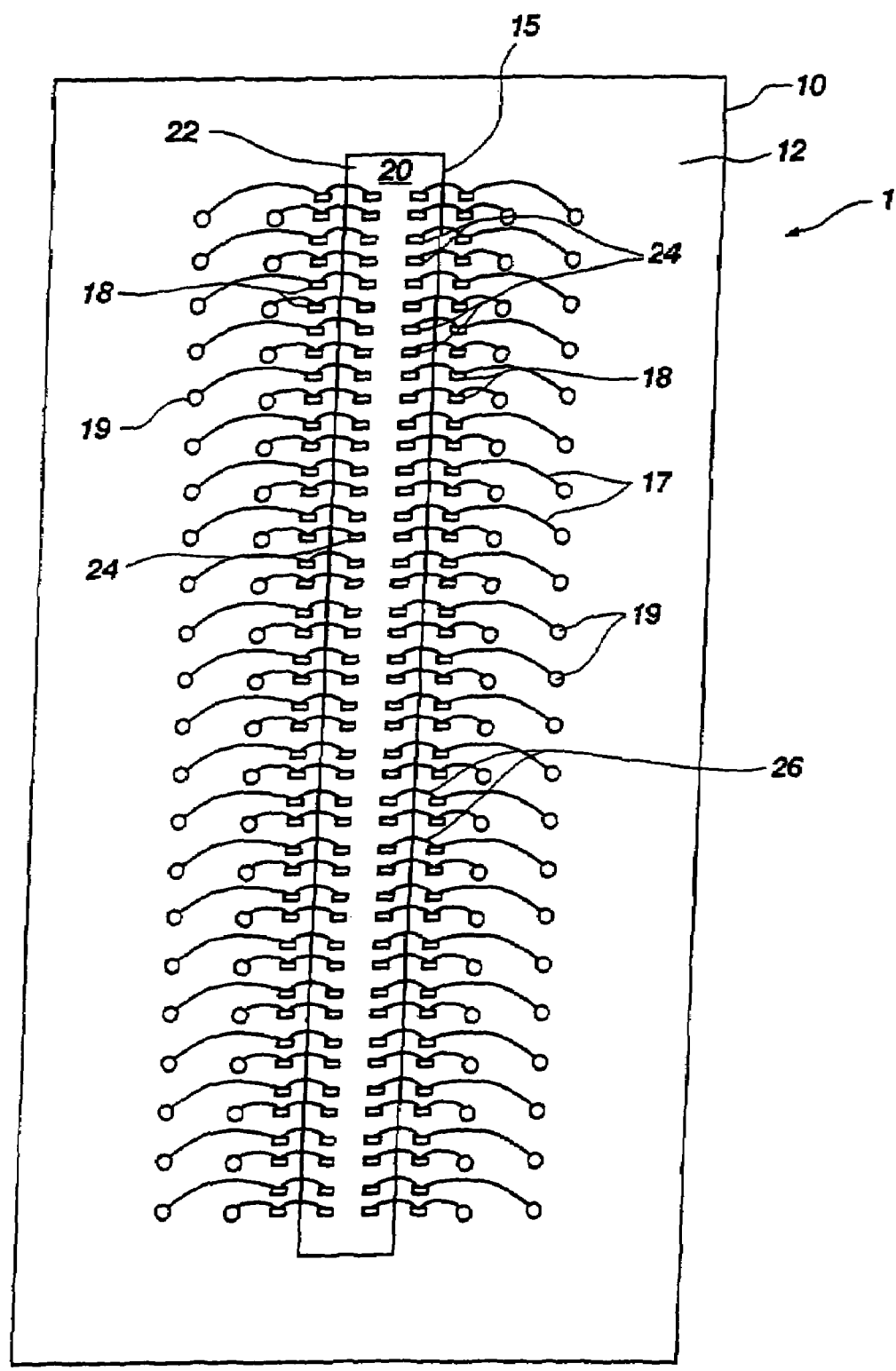
FIG. 1 illustrates a top view of a prior art "board-on-chip" BGA package.
Figure 2:
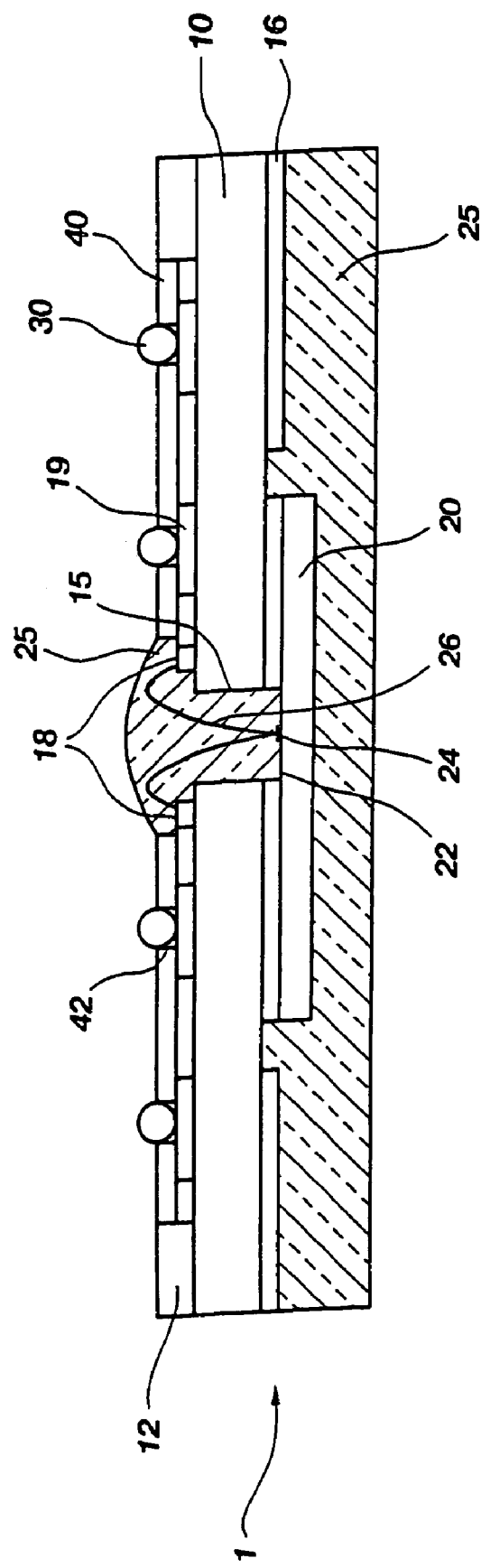
FIG. 2 illustrates a schematic cross-sectional view of a prior art "board-on-chip" BGA package.
Figure 3:
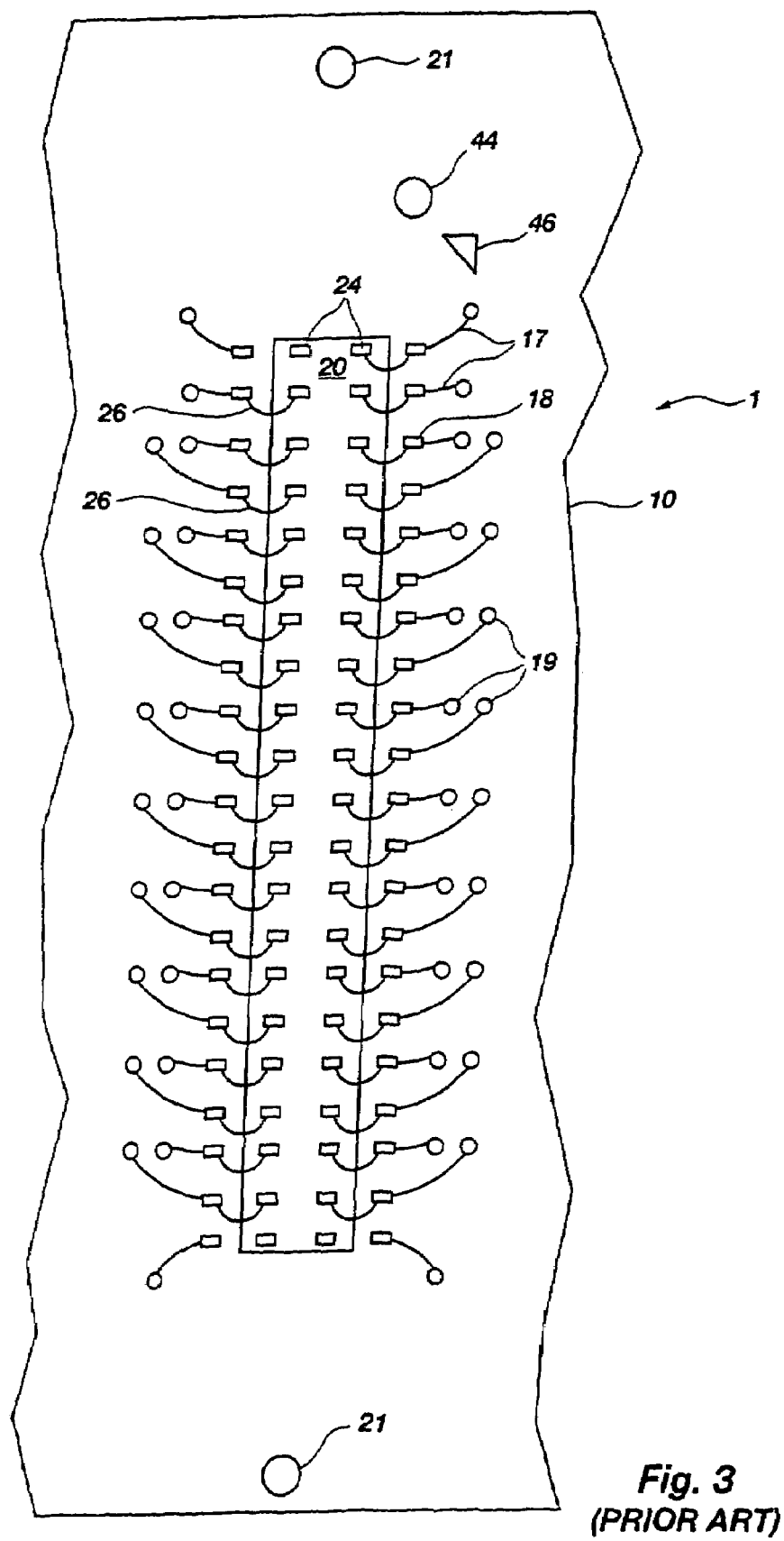
FIG. 3 illustrates a top view of a representative BGA substrate incorporating the use of a prior art alignment mark or fiducial and a pin one indicator.

A combination pin one indicator and alignment fiducial for automated die attach processes and substrate singulation is disclosed. In the following description, numerous specific details are set forth to provide a thorough understanding of the present invention. It will be apparent, however, to one of ordinary skill in the art that the specific details need not be employed in order to practice the present invention. In other instances, well-known materials or methods have not been described in detail in order to avoid obscuring the invention.

The present invention features a novel design for a pin one indicator and alignment fiducial that utilizes a single solder resist (also referred to herein as "solder mask") opening in a die mounting substrate (also referred to herein as a "carrier substrate") to perform the combined functions of prior art alignment fiducials and pin one indicators. The present invention further includes a carrier substrate configured with the combination pin one indicator and alignment fiducial, as well as methods of fabricating a semiconductor device package and a semiconductor carrier substrate using the novel combination pin one indicator and alignment fiducial.

As used herein, the term "combination pin one indicator and alignment fiducial" (also referred to herein as a "pin one indicator/alignment fiducial") generally refers to a mark in a solder mask surface associated with each die attach site of a mounting substrate, and which is configured with at least one axis suitable for both alignment of a semiconductor device during semiconductor die attach and alignment of a singulation saw or other severing apparatus during singulation of a package from a mounting substrate. The combination pin one indicator and fiducial may also be used for alignment of a mounting substrate and wire bonding or lead bonding apparatus during wire bonding or lead bonding operations. The term "combination pin one indicator and alignment fiducial" will be further clarified when considering the embodiments disclosed below.

In one embodiment, the combination pin one indicator/alignment fiducial is provided as disposed proximate a BGA of a mounting substrate. Preferably, the combination pin one indicator/alignment fiducial will be disposed adjacent a BGA of a substrate surface configured for forming a chip scale or other relatively densely populated package known in the art. The distinctive configuration of the combination pin one indicator/alignment fiducial can be recognized by a vision system and allows for precise alignment of a semiconductor device during die attach. The combination pin one indicator/alignment fiducial may also be used as a saw fiducial for a singulation saw employed to separate individual packages on a substrate array. In a preferred embodiment, the pin one indicator/alignment fiducial of the present invention is solder mask-defined by use of a laser to produce a highly defined and accurate mark. One of skill in the art will recognize that various lasers are available for this purpose, including YAG lasers, excimer lasers, and carbon dioxide lasers. Photoimaging processes known in the art may also be used to define the pin one indicator/alignment fiducial.

Figure 4:
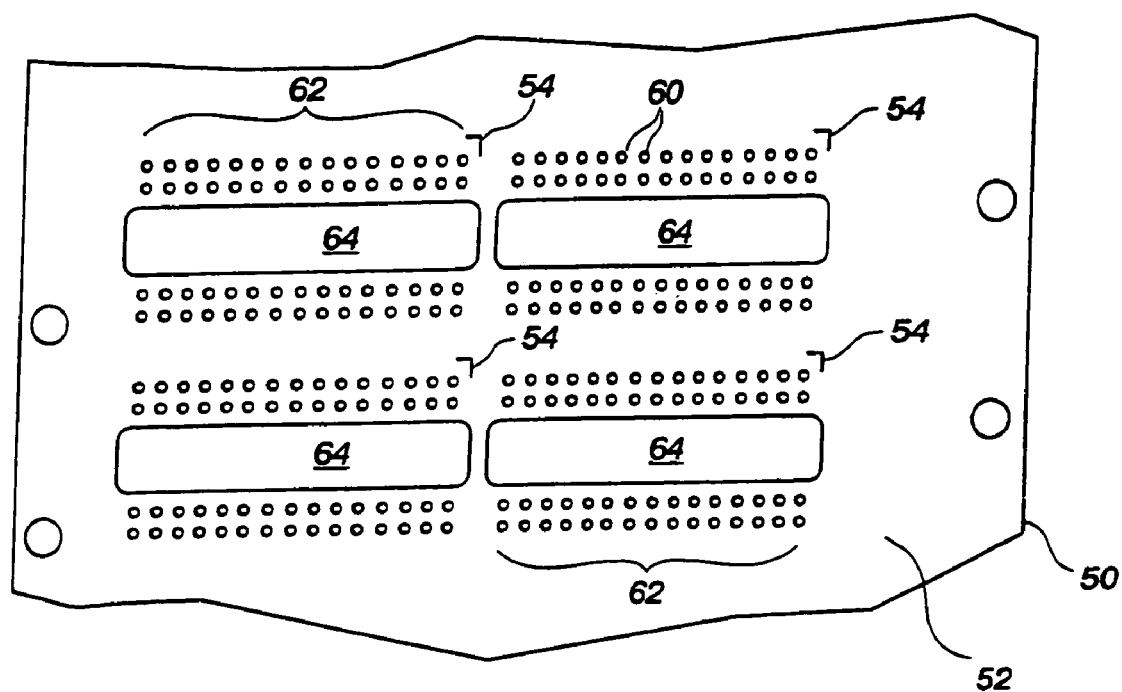
FIG. 4 is an overhead view of a simplified BGA substrate array with the combination pin one indicator and fiducial configured thereon.

Referring to drawing FIG. 4, and in accordance with an embodiment of the present invention, illustrated is a top view of a simplified BGA substrate 50. BGA substrate 50 includes a first surface 52 and an opposing second surface (not shown). Although only first surface 52 is shown, it is understood by one of skill in the art that the second surface of BGA substrate 50 may contain additional circuitry, such as conductors, and/or additional devices. As used herein, the term "conductors" refers to conductive metal placed on a mounting substrate surface. Thus, "conductors" may refer to contact pads, circuit traces, and any other type of conductive metal regions, pads or areas provided on a mounting substrate. On the first surface 52, shown as the upper surface of BGA substrate 50, an array of semiconductor device receiving sites or areas 64 for the mounting of a semiconductor device is provided. Surrounding each of the semiconductor device receiving sites 64 are connective elements forming a ball grid array 62, the ball grid array 62 being formed of a plurality of connective elements for electrically connecting a completed semiconductor device package to an external component, such as a module board or a second BGA semiconductor device package. The connective elements of each ball grid array 62 comprise contact pads (not shown) with solder balls 60 disposed thereon. Although solder balls 60 are not typically placed on contact pads until after a die attach and encapsulation process, solder balls 60 are included for ease of illustrating a representative BGA substrate. As can be seen in drawing FIG. 4, the connective elements are arranged in a preselected grid array pattern. On a corner perimeter region adjacent each ball grid array 62 in the substrate array, and in the corner associated with pin one placement for a semiconductor device to be placed on a semiconductor device receiving site 64, a pin one indicator/alignment fiducial 54 configured in accordance with the principles of the present invention is shown.

Figure 5A:
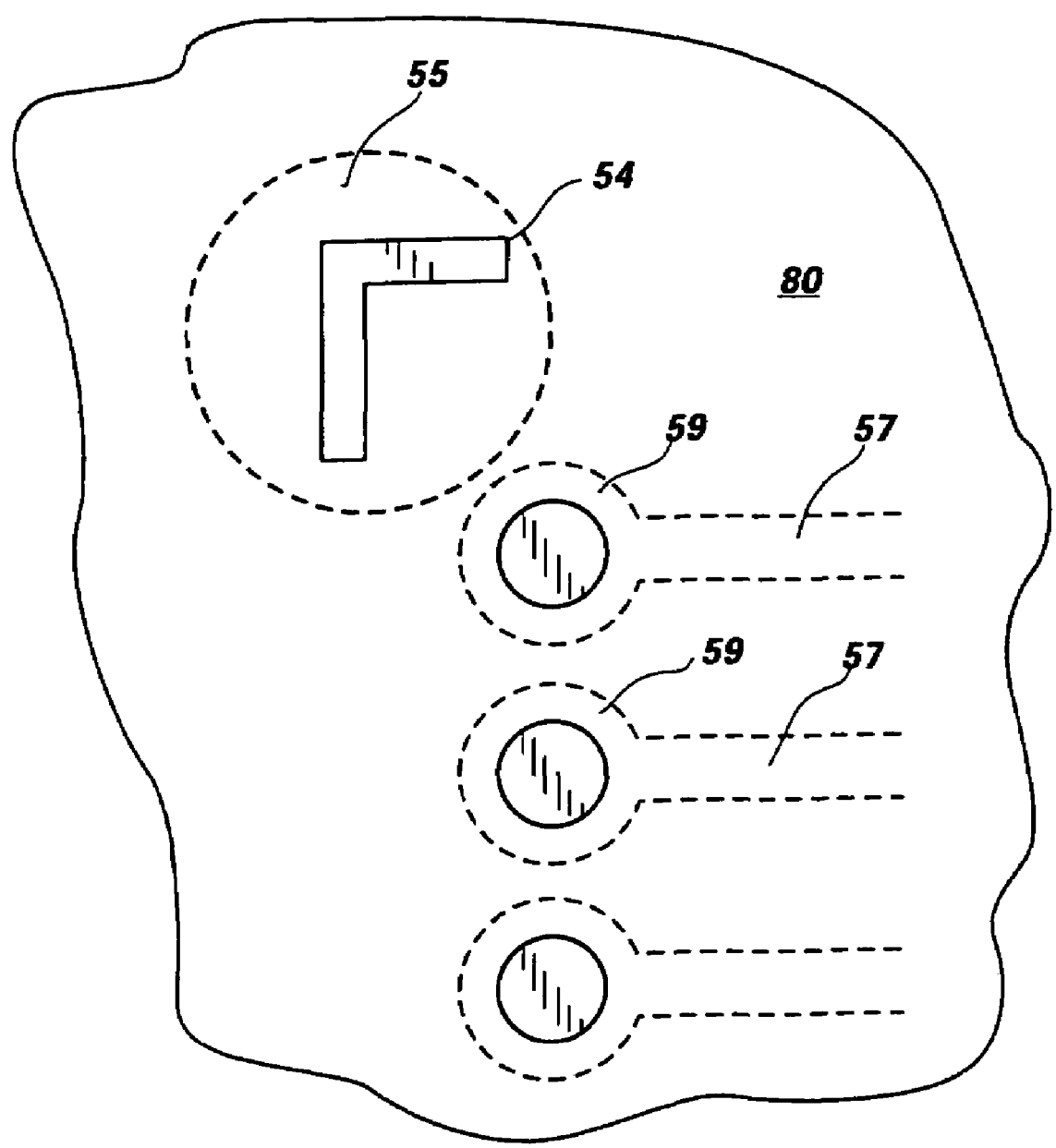
FIG. 5A is an embodiment of the preferred geometric shape of the combination pin one indicator and alignment fiducial of the present invention.

Preferably, pin one indicator/alignment fiducial 54 comprises an "L"-shaped and narrow opening in the solder mask layer 80 (FIG. 5A) in which two lines, substantially mutually perpendicular to one another, form components of an X-Y axis. The "L" shape of pin one indicator/alignment fiducial 54 can be inverted and/or spatially rotated to serve the purposes of the present invention. Illustrated in drawing FIG. 5A is an example of the preferred configuration for pin one indicator/alignment fiducial 54. Of the substantially mutually perpendicular lines, the aspect of the solder mask opening extending along the X axis is used for substrate position detection and alignment in the X direction, while the aspect of the solder mask opening extending along the Y axis is used for substrate position detection and alignment in the Y direction. Pin one indicator/alignment fiducial 54 is shown placed closely adjacent the array of solder mask-defined contact pads 59. A conductor pad 55, over which pin one indicator/alignment fiducial 54 is formed, is shown in outline form underlying solder mask layer 80, thus illustrating a preferred embodiment in which pin one indicator/alignment fiducial 54 is solder mask-defined. Circuit traces 57 are shown in electrical contact with contact pads 59 at one end and are extending towards contact pads 58 (FIG. 6) at an opposing end in furtherance of an electrical circuit. Contact pads 59 are also illustrated as solder mask-defined, with the portion of each contact pad 59 underlying solder mask layer 80 represented in outline form.

As can best be seen in drawing FIG. 4 the location of pin one indicator/alignment fiducial 54 can correspond to one or more exposed features on a carrier substrate. For example, one or more edge portions of pin one indicator/alignment fiducial 54 can be aligned with an axis of a conductive element and!or an edge of a semiconductor device to further enhance alignment capabilities.

Advantageously, the distinctive shape of pin one indicator/alignment fiducial 54 can be easily read by a vision system for proper orientation and alignment during die attach, the relatively narrow openings in the solder mask layer which form pin one indicator/alignment fiducial 54 serving to maximize the amount of real estate which can be used for substrate interconnections or other circuitry, such as for a densely populated BGA. The minimal opening in the solder mask layer further provides a more planar surface during clamping in the molding process, thus reducing resin bleed and flashing.

Additionally, pin one indicator/alignment fiducial 54 may be used to align a singulation saw or other substrate severing apparatus during singulation of individual semiconductor device packages. For example, a singulation saw can cut along one or both of the X or Y aspects of pin one indicator/alignment fiducial 54 wherein the X or Y aspects will form, or be closely associated with, package edges of an individual semiconductor device package. Thus, the placement of the solder mask-defined pin one indicator/alignment fiducial 54 in close proximity to the array of contact pads 59 and circuit traces 57 allows for a saw edge to be aligned with relatively tight tolerances to the solder mask openings around contact pads 59. In addition to maximizing the amount of real estate used per semiconductor device package, one of skill in the art will recognize that tight tolerances at the edge of a semiconductor device package are important for various electronic testing applications.

Figure 5B:
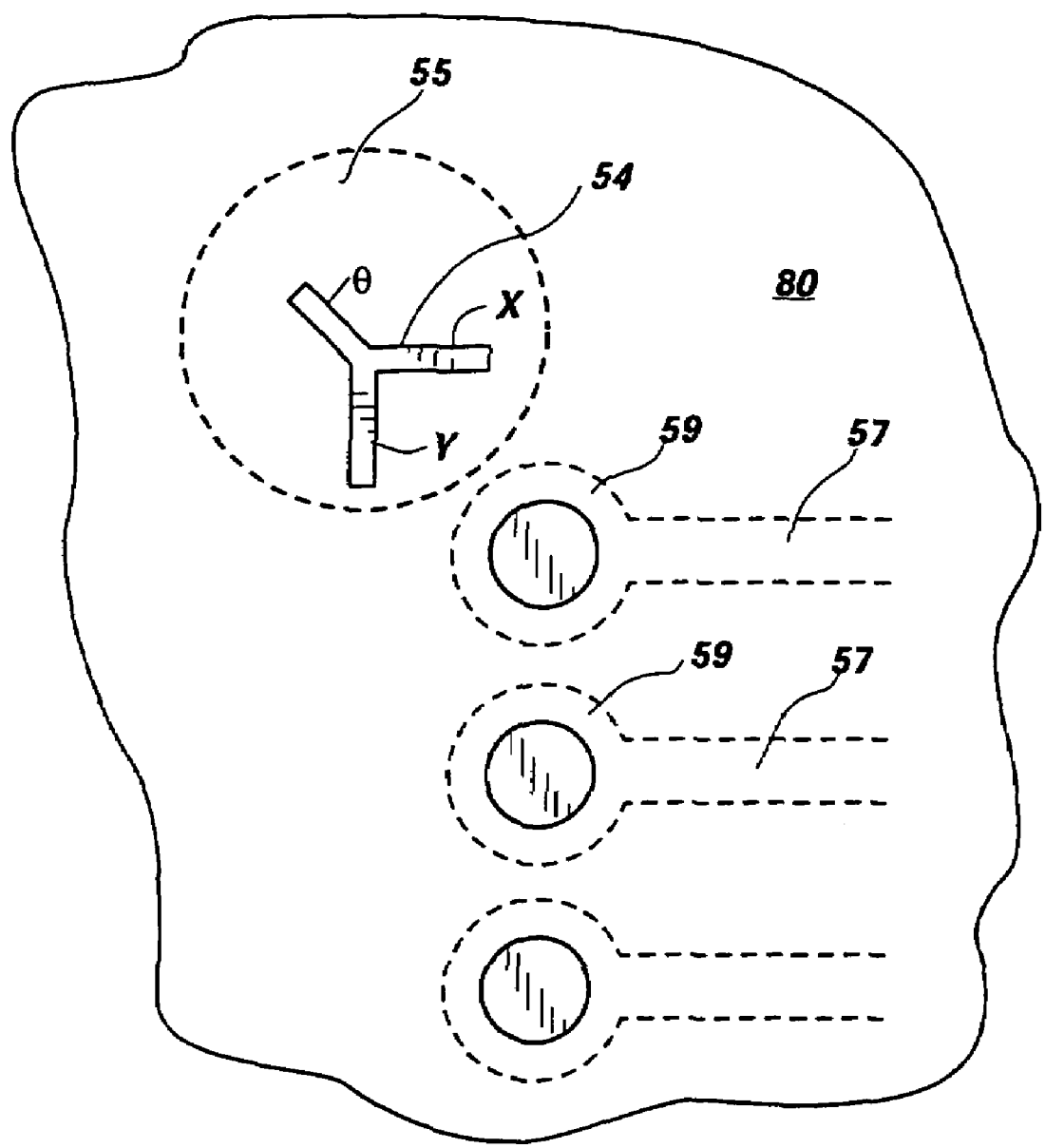
FIG. 5B is an example of an embodiment of the combination pin one indicator and alignment fiducial of the present invention.
Figure 5C:
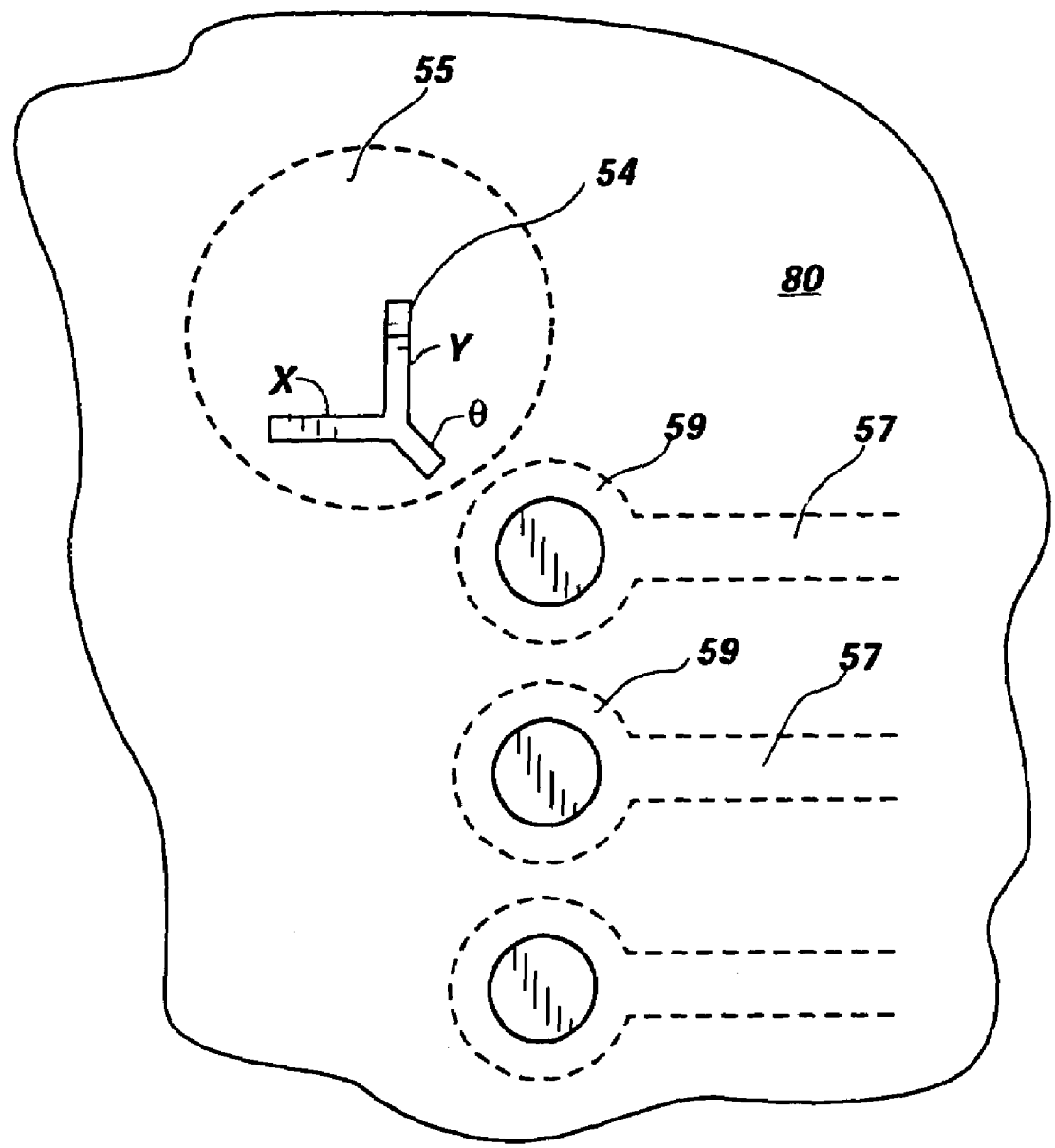
FIG. 5C is an example of an embodiment of the combination pin one indicator and alignment fiducial of the present invention.

It will be understood by one of skill in the art that pin one indicator/alignment fiducial 54 is not limited to the "L" shape described, but rather the critical factor in the configuration of pin one indicator/alignment fiducial 54 is that it allows for accurate alignment and orientation processes while providing only a minimal opening in the solder resist. Therefore, one of skill in the art will recognize that the pin one indicator/alignment fiducial of the present invention may be configured in a variety of other shapes which provide suitably minimal openings in the solder resist while still performing the combined functions of a pin one indicator and an alignment fiducial. Examples of geometrically different combination pin one indicator and alignment fiducials are illustrated in drawing FIGS. 5B and 5C. These embodiments include a third axis, θ, extending in a substantially forty-five degree (45°) angle from a point of intersection between the X and Y axes. Furthermore, while the combination pin one indicator and alignment fiducial of the present invention is preferably formed as a contiguous mark, recess or other opening in the solder mask layer, the combination pin one indicator and alignment fiducial may be formed of a combination of closely spaced marks, recesses or other openings in the solder resist grouped in such close proximity so as to be considered a single alignment feature, albeit serving multiple functions.

As pin one indicator/alignment fiducial 54 of the present invention is configured to provide only a minimal opening in the solder resist, smaller pitches between solder balls and tighter dimensional controls are possible. Therefore, the present invention is particularly useful for packages in which the solder resist surface of the mounting substrate is heavily populated with contact pads and/or solder balls, and in applications where the semiconductor device outline is nearly the same size as the singulated semiconductor device package (e.g., Chip Scale Packages (CSP), Near Chip Size Packages (NCS), etc.).

One of skill in the art will recognize that pin one indicator/alignment fiducial 54 has widespread applicability in the art of semiconductor packaging. In addition to the various types of ball grid arrays (FBGA, μBGA, low profile fine-pitch ball grid array (LPFPBGA), etc.) known in the art to be used for external interconnection of the chip package to, e.g., printed wiring boards, other IC chip packages, multi-chip modules, etc., the pin one indicator/alignment fiducial 54 of the present invention is useful for the construction of chip packages incorporating numerous other types of external interconnection arrays, such as pin connectors or wire bonds. Pin one indicator/alignment fiducial 54 can be used in packages utilizing a myriad of surface mount configurations, such as flip-chip, quad flatpack (QFP), etc., as well as chip packages designed for multi-chip stacking.

Referring again to drawing FIG. 4, BGA substrate 50 generally comprises an electrically insulating material. In one embodiment, BGA substrate 50 comprises a polymer laminate circuit board. BGA substrate 50 may also be formed of a variety of other materials, however, including, but not limited to, ceramics, metal (including metal leadframes), plastics, various organics, or combinations thereof, etc. BGA substrate 50 may be formed with or without cavities or recessed areas as the semiconductor device receiving areas 64. BGA substrate 50 may also be formed with a plurality of apertures therethrough to allow for construction of a board-on-chip array as previously described and as illustrated in FIG. 1. BGA substrate 50 may be configured with one or more semiconductor device receiving areas 64 formed on either the first surface 52 or the opposing second surface of the BGA substrate 50.

Figure 6:
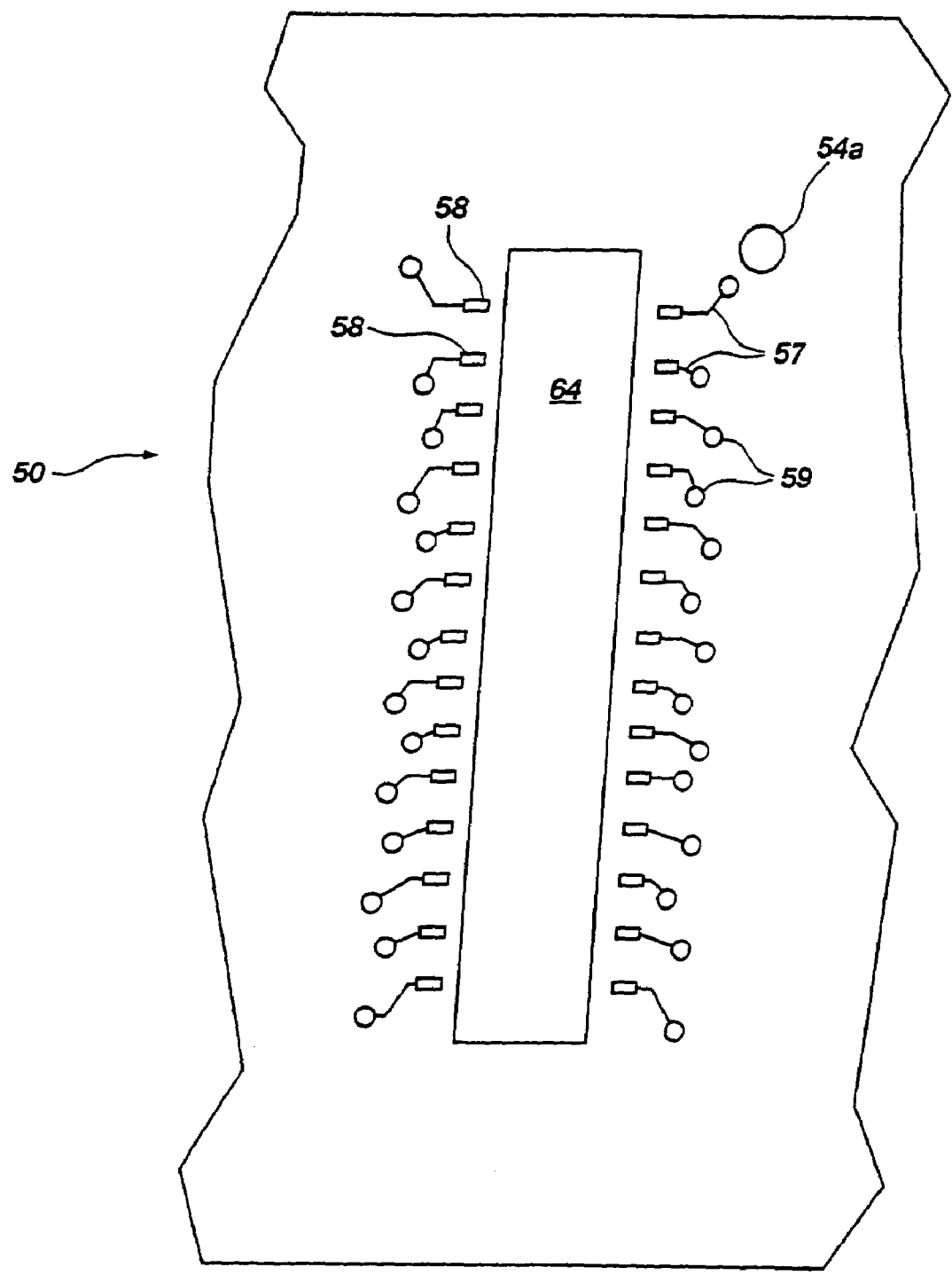
FIG. 6 is a simplified top view diagram of a portion of a BGA substrate showing a plurality of conductors formed on the substrate in a preselected grid array pattern prior to the deposition of a solder mask layer.

Methods of fabricating a carrier substrate and a semiconductor device package using the combination pin one indicator and alignment fiducial of the present invention will now be explained in more detail. Referring to drawing FIG. 6, a simplified diagram of a portion of BGA substrate 50 is shown with a plurality of conductors (pads 54a, circuit traces 57, contact pads 58, and contact pads 59) formed on the surface of the substrate prior to the deposition of a solder mask layer. Some of the conductors (contact pads 59) are provided in a preselected grid array pattern. Although the following steps will be described on a single substrate portion, in actual practice, the steps would be carried out on a plurality of substrate arrays configured for mounting a plurality of semiconductor dice. The conductors, which will underlie an insulating layer of solder mask, are formed adjacent a semiconductor device receiving area 64 and initially comprise a conductive metal which has been blanket deposited onto BGA substrate 50 by, for example, electroless or electrolytic plating. Subsequent to deposition of the metal layer, the conductors may be defined, for example, by an etching process. The required pattern of the conductors may also be formed by other methods known in the art, such as by electroless plating through a patterned mask. The conductors may comprise pad circuit traces 57, contact pads 58, and contact pads 59. Circuit traces 57 serve to provide an electrical connection between a respective plurality of contact pads 58 and contact pads 59. For substrates densely populated with conductors, circuit traces 57 are typically 8 mils wide or less. The conductors are preferably comprised of copper or aluminum, but may be comprised of any other electrically conductive materials known in the art, such as titanium, tungsten, gold, etc. Also shown in drawing FIG. 6 is an additional conductor segment or pad 54a formed as a small area of conductive metal which has been etched or plated closely adjacent the patterned conductors. In one embodiment, the small region of conductive metal pad 54a will serve as a feature underlying a solder mask opening that defines the pin one indicator/alignment fiducial 54 of the present invention. Alternatively, a solder ball contact pad 59, or other conductor formed in a pattern of conductors on BGA substrate 50, may serve as an underlying feature of pin one indicator/alignment fiducial 54.

Figure 7A:
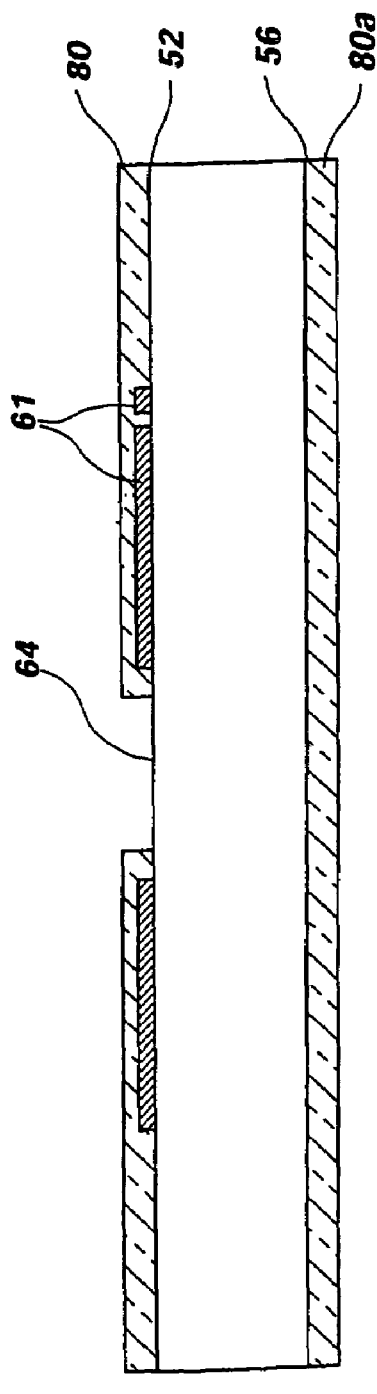

Referring to drawing FIG. 7A, a solder mask layer 80 has been formed over first (upper) surface 52 of BGA substrate 50 so as to cover each of the conductors 61 (e.g., circuit traces, bond pads, solder ball contact pads, or other conductive pads). A solder mask layer 80a may also be formed over the second (bottom) surface 56 of BGA substrate 50, dependent upon the presence or proximity of conductors or other circuitry thereon. Solder mask layer 80 is initially formed as a planar coat over substantially all portions of first surface 52 and bottom surface 56 of BGA substrate 50. Solder mask layer 80 may alternatively be applied to cover all portions of first surface 52 except for the semiconductor device receiving area 64. Solder mask layer 80 may be laminated, screen printed, sputtered, deposited by chemical vapor deposition, or otherwise formed by any means known in the art. Solder mask layer 80 is disposed over conductors 61 in a thickness and composition that shields conductors 61 on the first surface 52 from electrical shorts that might result, for example, from subsequent soldering or plating operations. Preferably, solder mask layer 80 is deposited in a thickness sufficient to cover each of contact pads 58 and contact pads 59, such that solder mask-defined pads, as previously described, can be formed through vias in the solder mask layer 80. A representative thickness of a solder mask layer 80 typically suitable for use in the present invention is from about 1 to about 4 mils. Preferably, a photoimageable dielectric material is used as the solder mask material. Solder mask materials are commercially available for this purpose. Solder mask materials found under the tradenames "PSR-4000" and "Au55," manufactured by Taiyo America, Inc., Carson City, Nev., are two such suitable solder mask materials. Materials that can be ablated by a laser without blistering or bubbling are also preferred. A solder mask material comprised of polytetrafluoroethylene (PETE) is one material suitable for use with a laser.

Figure 7B:
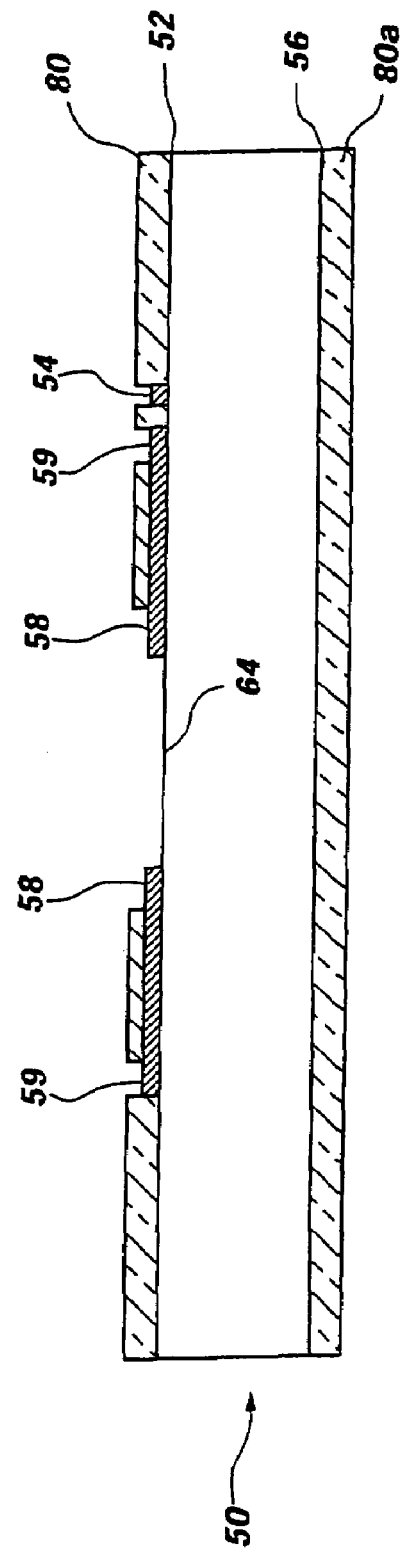

Following deposition of solder mask layers 80 and 80a, the photoimageable mask materials may be partially hardened at an elevated temperature (such as 95° C.) by a prebaking step, then exposed in a desired pattern by using UV light and a suitable mask. As a representative desired pattern, a mask for exposing solder mask layer 80 may expose and develop solder mask layer 80 such that openings or vias are formed in the solder mask layer 80 that expose contact pads 58, contact pads 59, pin one indicator/alignment fiducial 54, and semiconductor device receiving sites 64, as is shown in drawing FIG. 7B.

Figure 7C:
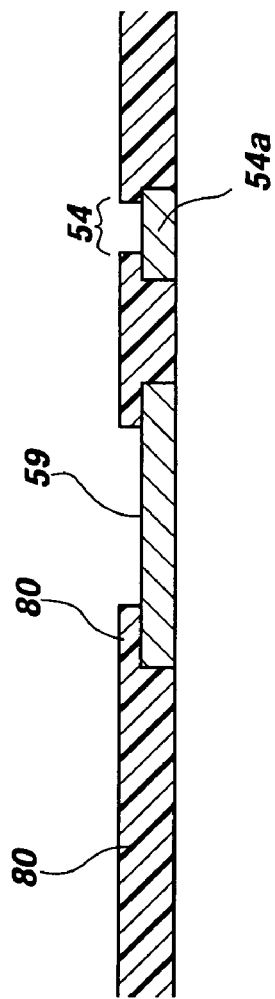

Preferably, the photoimaged openings in solder mask layer 80 over contact pads 59 and pin one indicator/alignment fiducial 54 are made smaller than the copper or conductive metal regions disposed underneath, making contact pads 59 and pin one indicator/alignment fiducial 54 solder mask-defined. In this embodiment, as is shown in drawing FIG. 7C, an area of solder mask preferably overlaps with the edges of the copper contact pads 59 and the additional conductor segment formed as a small area of conductive metal pad 54a. A representative overlap for a 23 mil pad diameter would be about 4 mils. In a further embodiment, a solder mask-defined opening defining pin one indicator/alignment fiducial 54 can be made by placing a mask or stencil over BGA substrate 50 and in registration with either the small region of conductive metal pad 54a, a contact pad 59, or other conductive feature underlying solder mask layer 80, then irradiating laser light through the opening. In a most preferred embodiment, a stereolithographic process, using a computerized 3D image of the desired solder mask layer 80 surface in combination with a laser beam to solidify photosensitive polymer liquid in the desired structure, can be used to tighten solder mask exposure in forming the contact pads 59 and pin one indicator/alignment fiducial 54. Stereolithography can be used instead of, or preferably in addition to, conventional photoimaging techniques or other techniques to form the solder mask surface and openings of solder mask layer 80.

Figure 7D:
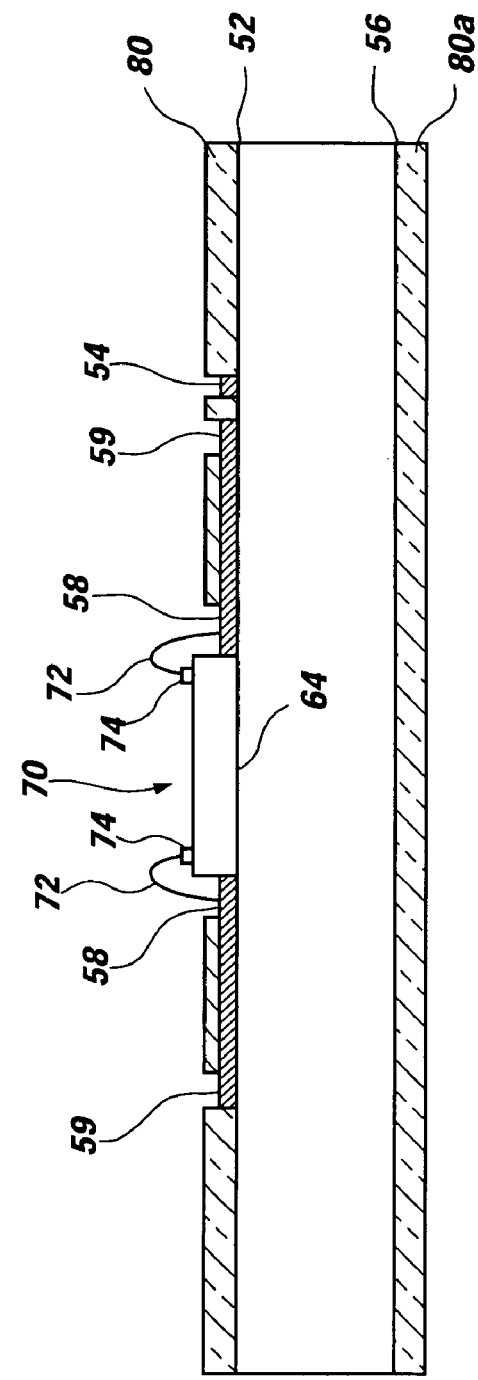

Following formation of solder mask layer 80, and the various contact pad 59, contact pad 58, pin one indicator/alignment fiducial 54 and semiconductor device receiving area 64 openings therethrough, a process of die attach is conducted. Reference is made to drawing FIG. 7B as representative of a BGA substrate 50 prepared for a die attach process. Illustrated in drawing FIG. 7D is an attached semiconductor device 70. In die attach, a die bonder's vision system determines die placement and precise adhesive dispensing by locating the distinctive configuration of pin one indicator/alignment fiducial 54, dispensing a precise amount of adhesive onto the correct location on semiconductor device receiving area 64, orienting a semiconductor die according to the pin one mounting area as shown by the location of pin one indicator/alignment fiducial 54, then driving the die bonding machine to adjust the substrate and die tool position for accurate placement and mounting of the semiconductor die. For some vision system apparatus, the backlighting may be adjusted to obtain an optimum reflective contrast between pin one indicator/alignment fiducial 54 and the surrounding area of BGA substrate 50. Due to the minimal opening in the solder mask layer 80 afforded by pin one indicator/alignment fiducial 54, a sophisticated vision system, such as PRS, is preferred for recognition of pin one indicator/alignment fiducial 54.

As shown in drawing FIG. 7D, after attaching semiconductor device 70 to BGA substrate 50, conductive wires 72 can be wire bonded to contact pads 58 of BGA substrate 50 and to corresponding bond pads 74 of semiconductor device 70. In this process, the vision system of a conventional wire bonding machine may utilize pin one indicator/alignment fiducial 54 for alignment purposes. The pin one indicator/alignment fiducial 54 of the present invention may also be used for alignment in a lead bonding process for mounted chips using leads, instead of wires, for interconnection with corresponding leads of a substrate.

As shown in drawing FIG. 7E, the wire interconnections (comprising conductive wires 72, contact pads 58 of BGA substrate 50, and corresponding bond pads 74 of semiconductor device 70) and semiconductor device 70 are encapsulated by, for example, molding compound 67 dispensed during a transfer molding encapsulation process. Due to the minimal opening in solder mask layer 80 afforded by pin one indicator/alignment fiducial 54, a more planar surface is created in the clamping area 51 of BGA substrate 50, thus reducing the chances of resin bleed and flashing during the molding process.

Referring to drawing FIG. 7F, following an encapsulation process, solder balls 60 can be bonded to contact pads 59 by, for example, the deposition of a solder flux on solder balls 60 and contact pads 59 in combination with a solder reflow process. The solder mask-defined openings over contact pads 59 facilitate alignment of solder balls 60 to contact pads 59, protect against solder ball 60 movement in the direction of an associated circuit trace 57, (see FIGS. 5A-5C and FIG. 6) and insulate solder balls 60 from other conductors underlying solder mask layer 80. The addition of solder balls 60 to contact pads 59 completes an individual BGA chip package.

To singulate an individual chip package from BGA substrate 50, pin one indicator/alignment fiducial 54 may be used in the alignment of a singulation saw. In this regard, a vision system recognizes pin one indicator/alignment fiducial 54 and directs a singulation saw to cut along BGA substrate 50 according to predetermined instructions associated with the X-Y axis of pin one indicator/alignment fiducial 54. In a related embodiment, the singulation saw may cut along one or both of the X or Y aspects of pin one indicator/alignment fiducial 54 wherein the X or Y aspects will form, or be closely associated with, package edges of an individual package. Such may allow for greater control of the relationship of the package edges relative to solder balls 60 placed on contact pads 59.

Figure 8:
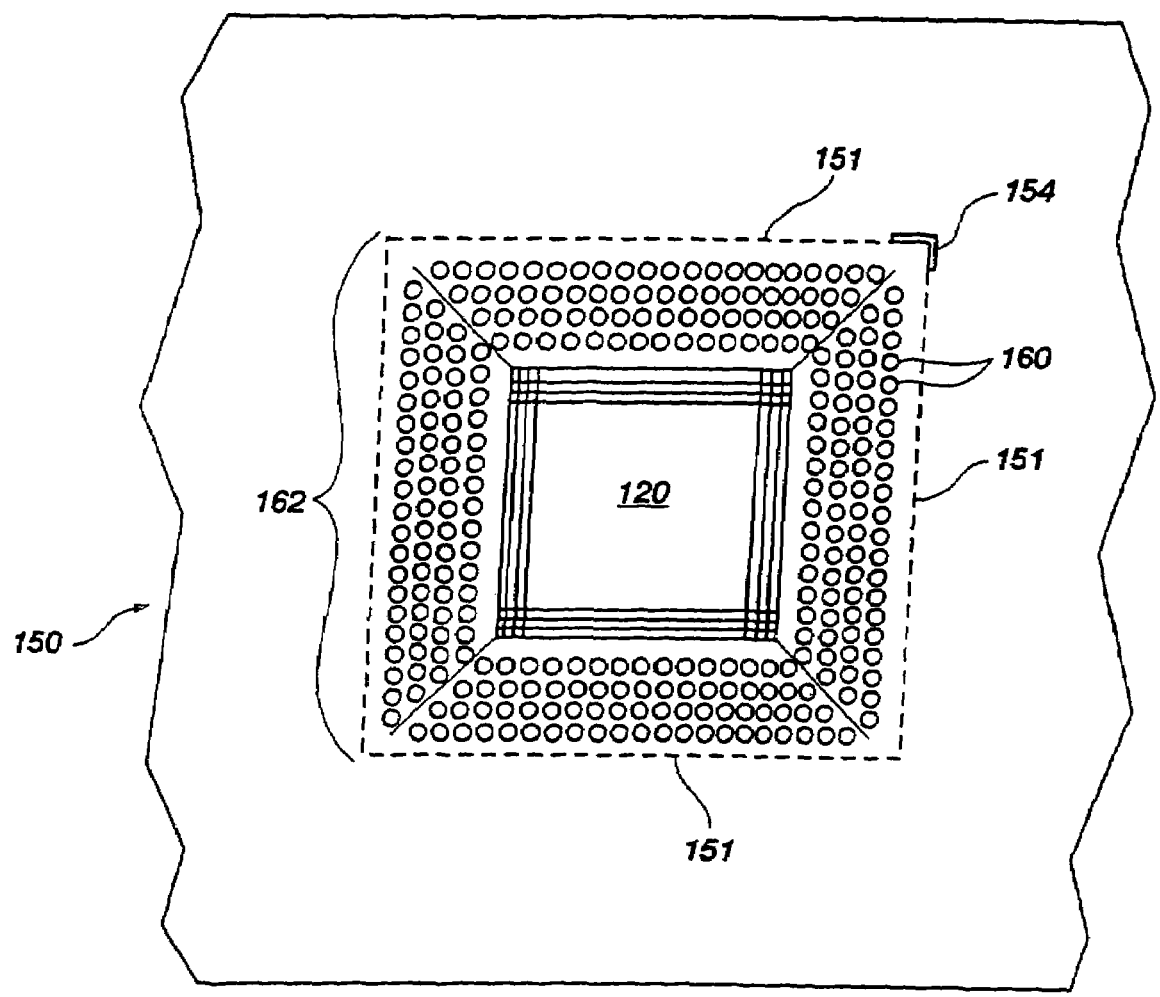
FIG. 8 illustrates a BGA substrate having a chip scale package and a combination pin one indicator and alignment fiducial prior to singulation.
Figure 9:
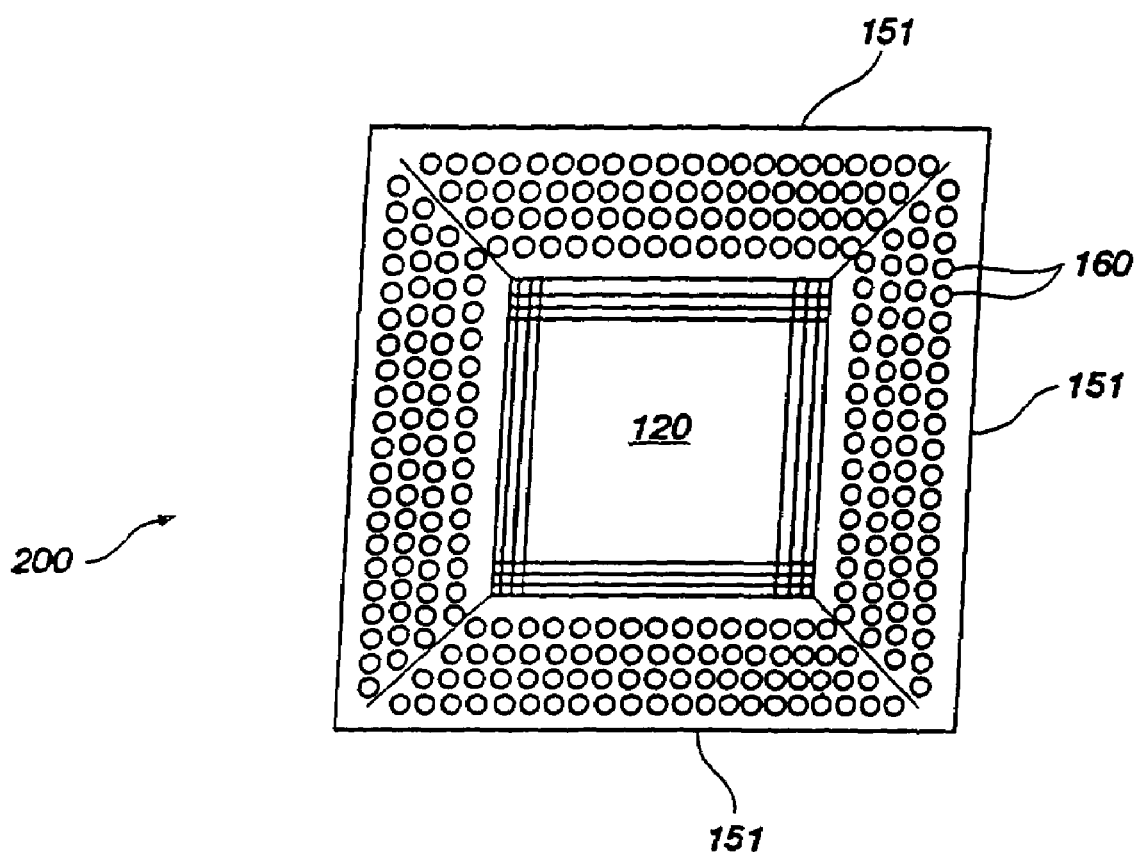
FIG. 9 shows a representative singulated chip scale package formed by the methods of the present invention.

As previously discussed, the pin one indicator/alignment fiducial of the present invention is most preferably used in association with chip scale packages, near chip scale packages, or other packages having dense arrays of conductors and interconnections. In drawing FIG. 8, a pin one indicator/alignment fiducial 154 is shown forming a package edge of a BGA substrate 150, wherein BGA substrate 150 is representative of a carrier substrate having at least one chip scale package formed thereon. As used herein, a "chip scale package" is defined as a surface mountable chip package which has an area that is no more than 1.2 times the area of the original semiconductor device. As referred to herein, a near chip scale package is one in which the package size is relatively slightly larger than 1.2 times the original semiconductor device size. Pin one indicator/alignment fiducial 154 is shown placed on a perimeter region outside of solder balls 160 and solder mask-defined contact pads (not shown). Solder balls 160 are shown disposed on respective contact pads located to form a ball grid array 162. The location of pin one indicator/alignment fiducial 154 further corresponds to a corner of BGA substrate 150 outside of the ball grid array 162 in closest proximity to the pin one mounting area for the pin one (not shown) of a semiconductor die 120. The positioning of pin one indicator/alignment fiducial 154 can be further said to correspond to a package edge 151 of a severable portion of BGA substrate 150. As referred to herein, a "package edge" means an edge of a semiconductor device package which is formed, or which can be formed, by severing a severable portion of a carrier substrate. Package edge 151 is shown in outline form, since the semiconductor device package has yet to be severed from BGA substrate 150. In this embodiment, a singulation saw can be aligned with pin one indicator/alignment fiducial 154 to cut along imaginary lines extending through, or immediately adjacent to, both the X and Y axes of pin one indicator/alignment fiducial 154 and along two severable edges (package edges) of BGA substrate 150. A chip scale package 200 singulated by the present method is shown in drawing FIG. 9.

It will be appreciated by those skilled in the art that the embodiments herein described, while illustrating certain embodiments, are not intended to so limit the invention or the scope of the appended claims. Those skilled in the art will also understand that various combinations or modifications of the preferred embodiments could be made without departing from the scope of the invention.

For example, this invention, while being described with reference to an electrically conductive substrate used for the mounting of semiconductor dice, has equal utility to any type of solder mask-coated substrate to be inscribed with fiducial marks and/or used in a semiconductor device mounting process. As one example, the pin one indicator/alignment fiducial of the present invention may be applied to the inactive side of a semiconductor die for orienting and aligning the semiconductor die during die attach. The embodiments of the present invention are also contemplated for use on wafer surfaces, including bumped wafer surfaces in particular, and can be applied at any stage in the semiconductor fabrication process. In addition, the pin one indicator/alignment fiducial may be applied to encapsulated semiconductor packages for various orientation and alignment processes, such as the mounting of a first BGA package to a second BGA package, or the mounting of a BGA package to a module board, such as a board comprising a memory module.

Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A method of fabricating a carrier substrate having a first surface and a second surface for mounting at least one semiconductor device, comprising:

forming at least one semiconductor device attach site on at least one of the first surface and the second surface;

forming a plurality of conductors on the at least one of the first surface and the second surface;

disposing a solder mask layer on at least part of the at least one of the first surface and the second surface; and providing an opening in the solder mask layer serving as a combination pin one indicator and alignment fiducial for both aligning a semiconductor device during a die attach process and for aligning a severing device for singulating the substrate.

2. The method of claim 1, wherein providing the at least one semiconductor device attach site comprises providing a plurality of semiconductor device attach sites, and wherein forming the plurality of conductors comprises forming a plurality of conductors associated with each of the plurality of semiconductor device attach sites.

3. The method of claim 2, wherein disposing the solder mask layer comprises disposing a solder mask layer on an area associated with each of the plurality of semiconductor device attach sites, and wherein providing the opening in the solder mask layer comprises providing an opening in a solder mask area associated with each of the plurality of semiconductor device attach sites.

4. The method of claim 3, wherein forming the plurality of conductors comprises forming a plurality of interconnected bond pads, circuit traces and solder ball contact pads associated with each of the plurality of semiconductor device attach sites.

5. The method of claim 4, wherein forming the plurality of solder ball contact pads further comprises arranging at least some of the plurality of solder ball contact pads in a preselected grid array pattern.

6. The method of claim 5, wherein arranging the at least some of the plurality of solder ball contact pads in the preselected grid array pattern includes locating the preselected grid array pattern adjacent at least one severable portion of the substrate.

7. The method of claim 6, wherein disposing the solder mask layer comprises disposing the solder mask layer over the plurality of conductors.

8. The method of claim 7, further comprising forming vias in the solder mask layer over the at least some of the plurality of solder ball contact pads in the preselected grid array pattern, the vias comprising solder mask-defined vias.

9. The method of claim 6, wherein providing the opening in the solder mask layer comprises providing an opening located over one of the plurality of conductors.

10. The method of claim 9, wherein providing the opening in the solder mask layer comprises forming the opening in the solder mask layer using photolithographic techniques.

11. The method of claim 9, wherein providing the opening in the solder mask layer comprises directing a laser light at the solder mask layer.

12. The method of claim 10, wherein providing the opening in the solder mask layer further comprises narrowing one or more sidewall areas of the opening using stereolithographic techniques.

13. The method of claim 9, wherein providing the opening in the solder mask layer further comprises configuring the combination pin one indicator and alignment fiducial as two substantially mutually perpendicular lines forming components of an X axis and a Y axis.

14. The method of claim 6, wherein providing the opening in the solder mask layer comprises locating the combination pin one indicator and alignment fiducial in an area adjacent the preselected grid array pattern.

15. The method of claim 14, wherein locating the combination pin one indicator and alignment fiducial in an area adjacent the preselected grid array pattern comprises locating the combination pin one indicator and alignment fiducial adjacent at least one severable portion of the substrate.

16. The method of claim 15, wherein locating the combination pin one indicator and alignment fiducial in an area adjacent the preselected grid array pattern comprises locating the combination pin one indicator and alignment fiducial on at least one severable package edge of the at least one severable portion of the substrate.

17. The method of claim 2, wherein providing the plurality of semiconductor device attach sites and forming the plurality of conductors associated with each of the plurality of semiconductor device attach sites comprises configuring the substrate for producing a plurality of ball grid array chip scale packages.

18. A method for fabricating a carrier substrate having a first surface and a second surface for mounting at least one semiconductor device, comprising:

forming at least one semiconductor device attach site on at least one of the first surface and the second surface;

forming a plurality of conductors on the at least one of the first surface and the second surface;

disposing a solder mask layer on at least part of the at least one of the first surface and the second surface; and providing an opening in the solder mask layer serving as a combination pin one indicator and alignment fiducial for both aligning a semiconductor device during a die attach process and for aligning a severing device for singulating the substrate.

19. The method of claim 18, wherein forming the at least one semiconductor device attach site comprises providing a plurality of semiconductor device attach sites, and wherein forming the plurality of conductors comprises forming a plurality of conductors associated with each of the plurality of semiconductor device attach sites.

20. The method of claim 19, wherein disposing the solder mask layer comprises disposing a solder mask layer on an area associated with each of the plurality of semiconductor device attach sites, and wherein providing the opening in the solder mask layer comprises providing an opening in a solder mask area associated with each of the plurality of semiconductor device attach sites.

21. The method of claim 20, wherein forming the plurality of conductors comprises forming a plurality of interconnected bond pads, circuit traces and solder ball contact pads associated with each of the plurality of semiconductor device attach sites.

22. The method of claim 21, wherein forming the plurality of solder ball contact pads further comprises arranging at least some of the plurality of solder ball contact pads in a preselected grid array pattern.

23. The method of claim 22, wherein arranging the at least some of the plurality of solder ball contact pads in the preselected grid array pattern includes locating the preselected grid array pattern adjacent at least one severable portion of the substrate.

24. The method of claim 22, further comprising forming vias in the solder mask layer over the at least some of the plurality of solder ball contact pads in the preselected grid array pattern, the vias comprising solder mask-defined vias.

25. The method of claim 24, wherein providing the opening in the solder mask layer comprises locating the combination pin one indicator and alignment fiducial in an area adjacent the preselected grid array pattern.

26. The method of claim 25, wherein locating the combination pin one indicator and alignment fiducial in an area adjacent the preselected grid array pattern comprises locating the combination pin one indicator and alignment fiducial adjacent at least one severable portion of the substrate.

27. The method of claim 26, wherein locating the combination pin one indicator and alignment fiducial in an area adjacent the preselected grid array pattern comprises locating the combination pin one indicator and alignment fiducial on at least one severable package edge of the at least one severable portion of the substrate.

28. The method of claim 19, wherein providing the plurality of semiconductor device attach sites and forming the plurality of conductors associated with each of the plurality of semiconductor device attach sites comprises configuring the substrate for producing a plurality of ball grid array chip scale packages.

29. The method of claim 19, wherein providing the plurality of semiconductor device attach sites and forming the plurality of conductors associated with each of the plurality of semiconductor device attach sites comprises configuring the substrate for producing a plurality of near chip scale packages.

30. The method of claim 18, wherein disposing the solder mask layer comprises disposing the solder mask layer over the plurality of conductors.

31. The method of claim 18, wherein providing the opening in the solder mask layer comprises providing an opening located over one of the plurality of conductors.

32. The method of claim 18, wherein providing the opening in the solder mask layer comprises forming the opening in the solder mask layer using photolithographic techniques.

33. The method of claim 18, wherein providing the opening in the solder mask layer comprises directing a laser light at the solder mask layer.

34. The method of claim 18, wherein providing the opening in the solder mask layer further comprises narrowing one or more sidewall areas of the opening using stereolithographic techniques.

35. The method of claim 18, wherein providing the opening in the solder mask layer further comprises configuring the combination pin one indicator and alignment fiducial as two substantially mutually perpendicular lines forming components of an X axis and a Y axis.

36. A method for fabricating at least a portion of a carrier substrate having a first surface and a second surface for mounting at least one semiconductor device, comprising:
    forming at least one semiconductor device attach site on at least one of the first surface and the second surface;
    forming a plurality of conductors on the at least one of the first surface and the second surface;
    disposing a solder mask layer on at least part of the at least one of the first surface and the second surface; and
    providing an opening in the solder mask layer serving as a combination pin one indicator and alignment fiducial for both aligning a semiconductor device during a die attach process and for aligning a severing device for singulating the substrate.

37. The method of claim 36, wherein forming the at least one semiconductor device attach site comprises providing a plurality of semiconductor device attach sites, and wherein forming the plurality of conductors comprises forming a plurality of conductors associated with each of the plurality of semiconductor device attach sites.

38. The method of claim 37, wherein disposing the solder mask layer comprises disposing a solder mask layer on an area associated with each of the plurality of semiconductor device attach sites, and wherein providing the opening in the solder mask layer comprises providing an opening in a solder mask area associated with each of the plurality of semiconductor device attach sites.

39. The method of claim 38, wherein providing the plurality of semiconductor device attach sites and forming the plurality of conductors associated with each of the plurality of semiconductor device attach sites comprises configuring the substrate for producing a plurality of ball grid array chip scale packages.

40. The method of claim 37 wherein forming the plurality of conductors comprises forming a plurality of interconnected bond pads, circuit traces and solder ball contact pads associated with each of the plurality of semiconductor device attach sites.

41. The method of claim 40, wherein forming the plurality of solder ball contact pads further comprises arranging at least some of the plurality of solder ball contact pads in a preselected grid array pattern.

42. The method of claim 41, wherein arranging the at least some of the plurality of solder ball contact pads in the preselected grid array pattern includes locating the preselected grid array pattern adjacent at least one severable portion of the substrate.

43. The method of claim 41, wherein providing the opening in the solder mask layer comprises locating the combination pin one indicator and alignment fiducial in an area adjacent the preselected grid array pattern.

44. The method of claim 43, wherein locating the combination pin one indicator and alignment fiducial in an area adjacent the preselected grid array pattern comprises locating the combination pin one indicator and alignment fiducial adjacent at least one severable portion of the substrate.

45. The method of claim 44, wherein locating the combination pin one indicator and alignment fiducial in an area adjacent the preselected grid array pattern comprises locating the combination pin one indicator and alignment fiducial on at least one severable package edge of the at least one severable portion of the substrate.

46. The method of claim 36, wherein disposing the solder mask layer comprises disposing the solder mask layer over the plurality of conductors.

47. The method of claim 46, further comprising forming vias in the solder mask layer over the at least some of the plurality of solder ball contact pads in the preselected grid array pattern, the vias comprising solder mask-defined vias.

48. The method of claim 36, wherein providing the opening in the solder mask layer further comprises configuring the combination pin one indicator and alignment fiducial as two substantially mutually perpendicular lines forming components of an X axis and a Y axis.

49. The method of claim 36, wherein providing the opening in the solder mask layer comprises providing an opening located over one of the plurality of conductors.

50. The method of claim 36, wherein providing the opening in the solder mask layer comprises forming the opening in the solder mask layer using photolithographic techniques.

51. The method of claim 36, wherein providing the opening in the solder mask layer comprises directing a laser light at the solder mask layer.

52. The method of claim 36, wherein providing the opening in the solder mask layer further comprises narrowing one or more sidewall areas of the opening using stereolithographic techniques.

* * * * *